(12) United States Patent  
Nomaguchi et al.

(10) Patent No.: US 7,955,880 B2
(45) Date of Patent: Jun. 7, 2011

(54) METHOD OF PRODUCING SEMICONDUCTOR OPTICAL DEVICE

(75) Inventors: Toshio Nomaguchi, Yokohama (JP); Tetsuya Hattori, Yokohama (JP); Kazunori Fujimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 52 days.

(21) Appl. No.: 12/481,870

(22) Filed: Jun. 10, 2009

(65) Prior Publication Data

US 2009/0317929 A1 Dec. 24, 2009

(30) Foreign Application Priority Data

Jun. 20, 2008 (JP) ................................ 2008-162219

(51) Int. Cl.
*H01L 21/00* (2006.01)
(52) U.S. Cl. .............. 438/44; 257/E21.09; 257/E21.461
(58) Field of Classification Search .................... 438/44, 438/478; 257/95, 98, 103, E21.09, E21.133, 257/E21.461
See application file for complete search history.

(56) References Cited

U.S. PATENT DOCUMENTS

2003/0218179 A1* 11/2003 Koide et al. ..................... 257/95
2006/0084245 A1* 4/2006 Kohda .......................... 438/478

OTHER PUBLICATIONS

Peng et al.; "Low-Cost and High-Performance 1.3-μm AlGaInAs-InP Uncooled Laser Diodes"; IEEE Photonics Technology Letter; vol. 18; No. 12; Jun. 15, 2006.

* cited by examiner

*Primary Examiner* — Brook Kebede
(74) *Attorney, Agent, or Firm* — Smith, Gambrell & Russell, LLP

(57) ABSTRACT

A method of producing a semiconductor optical device includes a first step of growing a stacked semiconductor layer including a first III-V group compound semiconductor layer for an active layer on a substrate; a second step of forming a silicon oxide film on the stacked semiconductor layer, the silicon oxide film having a predetermined film stress and a predetermined thickness; a third step of forming a strip-shaped groove in the silicon oxide film by etching the silicon oxide film, using a resist pattern formed on the silicon oxide film, until a surface of the stacked semiconductor layer is exposed; and a fourth step of growing a second III-V group compound semiconductor layer in the groove using the silicon oxide film as a selective mask.

9 Claims, 7 Drawing Sheets

METHOD OF PRODUCING SEMICONDUCTOR OPTICAL DEVICE

BACKGROUND OF THE INVENTION

1. Field of the Invention

The present invention relates to a method of producing a semiconductor optical device.

2. Description of the Related Art

A ridge type semiconductor optical device is known as a conventional art, which is described in Non-Patent Reference (IEEE PHOTONICS TECHNOLOGY LETTER, VOL. 18, NO. 12, JUN. 15, 2006). FIGS. 7A to 7D show an example of a method of producing a conventional ridge type semiconductor optical device. As shown in FIG. 7A, first, a stacked semiconductor layer 104 including an active layer 102, a cladding layer 103, etc. is formed on a semiconductor substrate 101. A mask pattern 105, for example, composed of silicon nitride (SiN) is formed on the stacked semiconductor layer 104. Next, as shown in FIG. 7B, a ridge 106 is formed by a dry etching process using the mask pattern 105. Next, as shown in FIG. 7C, after the mask pattern 105 is removed, a $SiO_2$ film 107 is formed thickly so as to cover the ridge 106. Next, as shown in FIG. 7D, by polishing the surface of the $SiO_2$ film 107, the $SiO_2$ film covering the ridge 106 is removed. As a result, the ridge 106 is exposed, and the top surface of optical device including the ridge structure is planarized.

SUMMARY OF THE INVENTION

As described above, in the conventional production process, after a ridge structure is formed on a semiconductor wafer, a thick $SiO_2$ film is formed to cover the ridge structure. The thickness of the $SiO_2$ film is larger than the height of the ridge. Next, the top surface of the ridge is exposed by polishing the surface of the $SiO_2$ film, and the top surface of the optical device is planarized. However, in the conventional production process, the semiconductor optical device may be mechanically damaged in the polishing process.

It is an object of the present invention to provide a method of producing a semiconductor optical device in which a semiconductor wafer is prevented from being damaged during the production process of the semiconductor optical device.

A method of producing a semiconductor optical device according to the present invention includes a first step of growing a stacked semiconductor layer including a first III-V group compound semiconductor layer for an active layer on a substrate; a second step of forming a silicon oxide film on the stacked semiconductor layer, the silicon oxide film having a predetermined film stress and a predetermined thickness; a third step of forming a strip-shaped groove in the silicon oxide film by etching the silicon oxide film, using a resist pattern formed on the silicon oxide film, until a surface of the stacked semiconductor layer is exposed; and a fourth step of growing a second III-V group compound semiconductor layer in the groove using the silicon oxide film as a selective mask.

The method according to the present invention includes the first to fourth steps. In the method according to the present invention, a silicon oxide film is formed first, a strip-shaped groove is then formed in silicon oxide film, and a semiconductor layer is formed in the groove. Consequently, it is possible to produce a ridge type semiconductor optical device without polishing a silicon oxide film formed on the upper surface of the ridge. Therefore, it is possible to prevent the semiconductor wafer from being damaged by polishing.

In the method of the present invention, in the second step, preferably, the silicon oxide film is formed such that the film stress is equal to or higher than −100 MPa and equal to or lower than +100 MPa in a temperature range of 500° C. to 700° C., and in the fourth step, preferably, the second III-V group compound semiconductor layer is grown in the temperature range of 500° C. to 700° C.

Furthermore, in the method of the present invention, in the second step, more preferably, the silicon oxide film is formed such that the film stress is equal to or higher than −100 MPa and equal to or lower than 0 MPa in a temperature range of 500° C. to 700° C.

In the case where the silicon oxide film is formed such that the film stress is, preferably, equal to or higher than −100 MPa and equal to or lower than +100 MPa, and more preferably, equal to or higher than −100 MPa and equal to or lower than 0 MPa in a temperature range of 500° C. to 700° C., when a second III-V group compound semiconductor layer for a cladding layer is grown in the temperature range, the silicon oxide film has low stress. Consequently, it is possible to prevent, for example, the substrate or the like from being broken due to the high stress of the silicon oxide film when the second III-V group compound semiconductor layer is grown. Furthermore, since the second III-V group compound semiconductor layer is grown in the groove formed in the silicon oxide film having low stress, the second III-V group compound semiconductor layer can be grown in the groove without thermally deforming the shape of the groove. Furthermore, it is possible to prevent the occurrence of cracks or separation in the silicon oxide film during the growth of the second III-V group compound semiconductor layer.

Furthermore, in the method of the present invention, preferably, the silicon oxide film has a positive temperature coefficient of film stress between room temperature and the growth temperature during the growth of the second III-V group compound semiconductor layer in the fourth step.

In such a case, the film stress of the silicon oxide film decreases as the temperature increases during the growth of the second III-V group compound semiconductor layer for the cladding layer.

Furthermore, in the method of the present invention, preferably, the silicon oxide film is formed using inductively coupled plasma CVD equipment, and the film stress of the silicon oxide film is adjusted by controlling the bias power of the inductively coupled plasma CVD equipment.

In such a method, by controlling the bias power of the inductively coupled plasma CVD equipment, the film stress of the silicon oxide film can be appropriately adjusted depending on the situation.

Furthermore, in the method of the present invention, in the fourth step, preferably, the second III-V group compound semiconductor layer is grown by metal-organic vapor phase epitaxy.

Furthermore, in the method of the present invention, in the second step, preferably, the predetermined thickness of the silicon oxide film is substantially the same as the thickness of the second III-V group compound semiconductor layer.

By forming the silicon oxide film with substantially the same thickness as the thickness of the second III-V group compound semiconductor layer, in the fourth step, the second III-V group compound semiconductor layer for the cladding layer can be easily grown using the groove having the depth corresponding to the large thickness. Furthermore, the fact that the resulting semiconductor optical device has the thick silicon oxide film leads to a decrease in the capacitance of the semiconductor optical device. As a result, it is possible to produce a semiconductor optical device that is suitable for high-speed operation.

Furthermore, in the method of the present invention, in the second step, preferably, the predetermined thickness of the silicon oxide film is 1 μm or more.

Furthermore, in the method of the present invention, in the third step, preferably, the silicon oxide film is etched substantially perpendicularly to a stacked surface of the stacked semiconductor layer.

Since the silicon oxide film is etched substantially perpendicularly in such a manner, the wall surface of the groove formed by etching is substantially perpendicular to the surface of the stacked semiconductor layer. As a result, the second III-V group compound semiconductor layer to be grown in the groove can be grown substantially perpendicularly.

Furthermore, in the method of the present invention, preferably, in the first step, the stacked semiconductor layer is grown by growing a third III-V group compound semiconductor layer for a cladding layer of a first conductivity type and the first III-V group compound semiconductor layer for the active layer in that order; in the fourth step, the second III-V group compound semiconductor layer is a III-V group compound semiconductor layer for a cladding layer of a second conductivity type; and the method further includes a fifth step of growing a fourth III-V group compound semiconductor layer for a contact layer on the second III-V group compound semiconductor layer, and a sixth step of forming an electrode on the fourth III-V group compound semiconductor layer.

The method of the present invention is suitable for producing a ridge type semiconductor optical device. Furthermore, in the method of the present invention, since a step of opening a window, which is difficult to carry out, is not required, the steps and cost for producing the semiconductor optical device can be reduced.

The object and other objects, features, and advantages of the present invention will become more apparent from the detailed description given hereinafter with reference to the accompanying drawings which are examples.

DESCRIPTION OF THE PREFERRED EMBODIMENTS

Figure 1A:
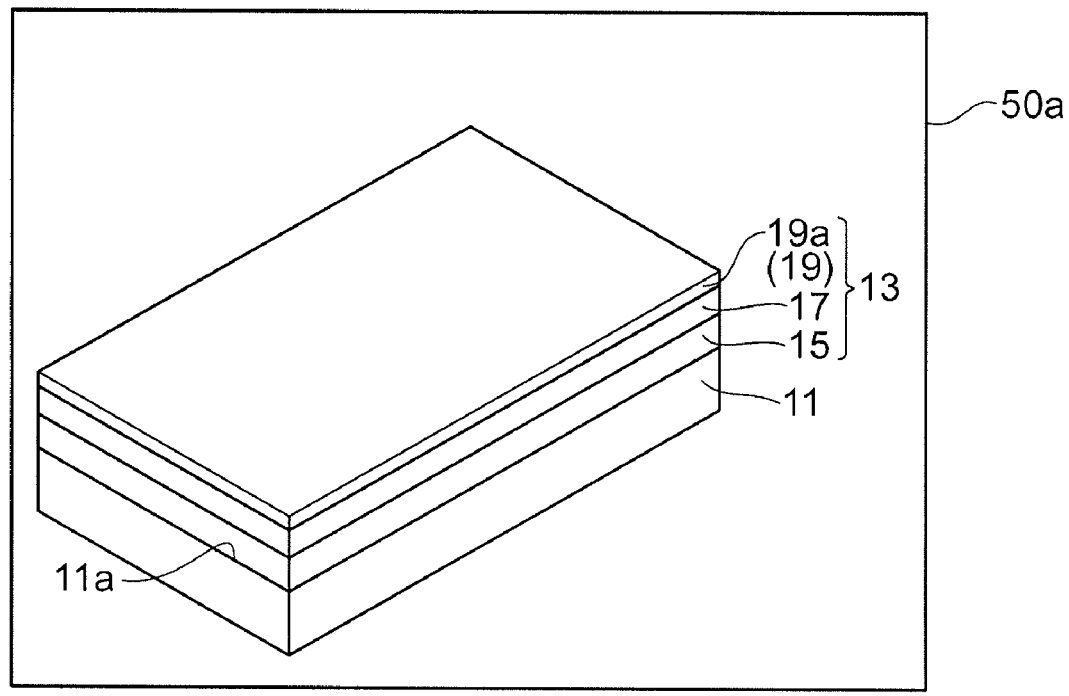
FIG. 1A is a view showing an epitaxial growth step, which is a first step.

The preferred embodiments regarding a method of producing a semiconductor optical device according to the present invention will be described below with reference to the drawings. In the description hereinafter, the same components are designated by the same reference numerals, and duplicate descriptions are omitted. Furthermore, the scales in the drawings are not necessarily equal to those in the description.

In this embodiment, as an example of a semiconductor optical device, a semiconductor light-emitting device, such as a semiconductor laser, is produced. A method of producing a semiconductor laser 1 (first to sixth steps) will be described in detail below with reference to FIGS. 1A to 5B.

(First Step)

Figure 1B:
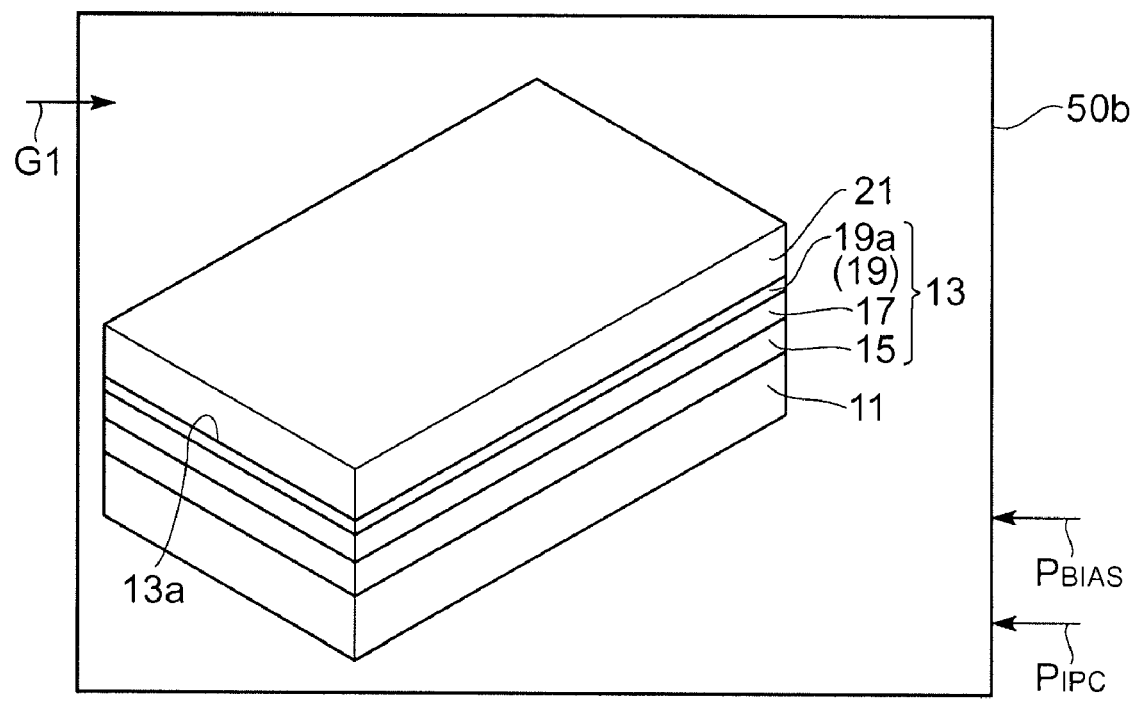
FIG. 1B is a view showing a silicon oxide film formation step, which is a second step.

FIGS. 1A and 1B are views showing steps of producing the semiconductor laser 1. First, a substrate 11 of a first conductivity type is prepared. In this embodiment, as the substrate 11 of the first conductivity type, for example, an n-type InP semiconductor substrate is used. The substrate 11 is placed in a growth furnace 50a. As the growth furnace, a metal-organic vapor phase epitaxy (MOVPE) furnace is used.

Next, as shown in FIG. 1A, a stacked semiconductor layer 13 is formed on a surface 11a of the substrate 11. The stacked semiconductor layer 13 included a plurality of semiconductor layers made of III-V group compound semiconductors, and these III-V group compound semiconductor layers are grown sequentially on the substrate 11. The stacked semiconductor layer 13 can include a cladding layer 15 (third III-V group compound semiconductor layer) of the first conductivity type, an active layer 17 (first III-V group compound semiconductor layer), and a portion 19a of a cladding layer 19 of a second conductivity type constituting a ridge. The semiconductor layers 15, 17, and 19a constituting the stacked semiconductor layer 13 can be grown, for example, using a metal-organic vapor phase epitaxy (MOVPE) method. The thickness of the stacked semiconductor layer 13 is, for example, 1.0 μm or more.

An example of a structure of the stacked semiconductor layer 13 for the semiconductor laser 1 is as follows:

Cladding layer 15 of first conductivity type: n-type InP, 1.0 μm in thickness

Active layer 17: GaInAsP multiple quantum well structure, 0.2 μm in thickness

Portion 19a of cladding layer 19 of second conductivity type: p-type InP, 0.1 μm in thickness The emission wavelength of the active layer 17 is, for example, 1.55 μm. The active layer 17 may have a bulk structure, a single quantum well structure, a multiple quantum well structure, or any of other various structures. Although not shown, the semiconductor laser 1 can have an SCH structure in which optical guiding layers are disposed on the upper and lower sides of a well layer of the quantum well structure. Furthermore, as necessary, instead of the n-type cladding layer, a surface layer region of the n-type InP substrate may be used as an n-type cladding layer.

(Second Step)

Next, as shown in FIG. 1B, by supplying a raw material gas G1 into chemical vapor deposition (CVD) equipment 50b, a silicon oxide film 21 with a thickness of 1.0 to 2.0 μm is deposited on the stacked semiconductor layer 13. The thickness of the silicon oxide film 21 is preferably larger than the thickness of another portion 19b of the p-type cladding layer 19 constituting the ridge (i.e., second III-V group compound semiconductor layer, which will be described later). Furthermore, the thickness of the silicon oxide film 21 is preferably, for example, 3.0 μm or less in order to smoothly control the film stress in the inductively coupled plasma CVD equipment, which will be described below.

As the chemical vapor deposition (CVD) equipment for forming the silicon oxide film 21, inductively coupled plasma (ICP) CVD equipment 50b can be employed. The silicon oxide film 21 with low stress can be formed at a relatively low deposition temperature and at a high deposition rate by using the inductively coupled plasma (ICP) CVD method.

Figure 6:
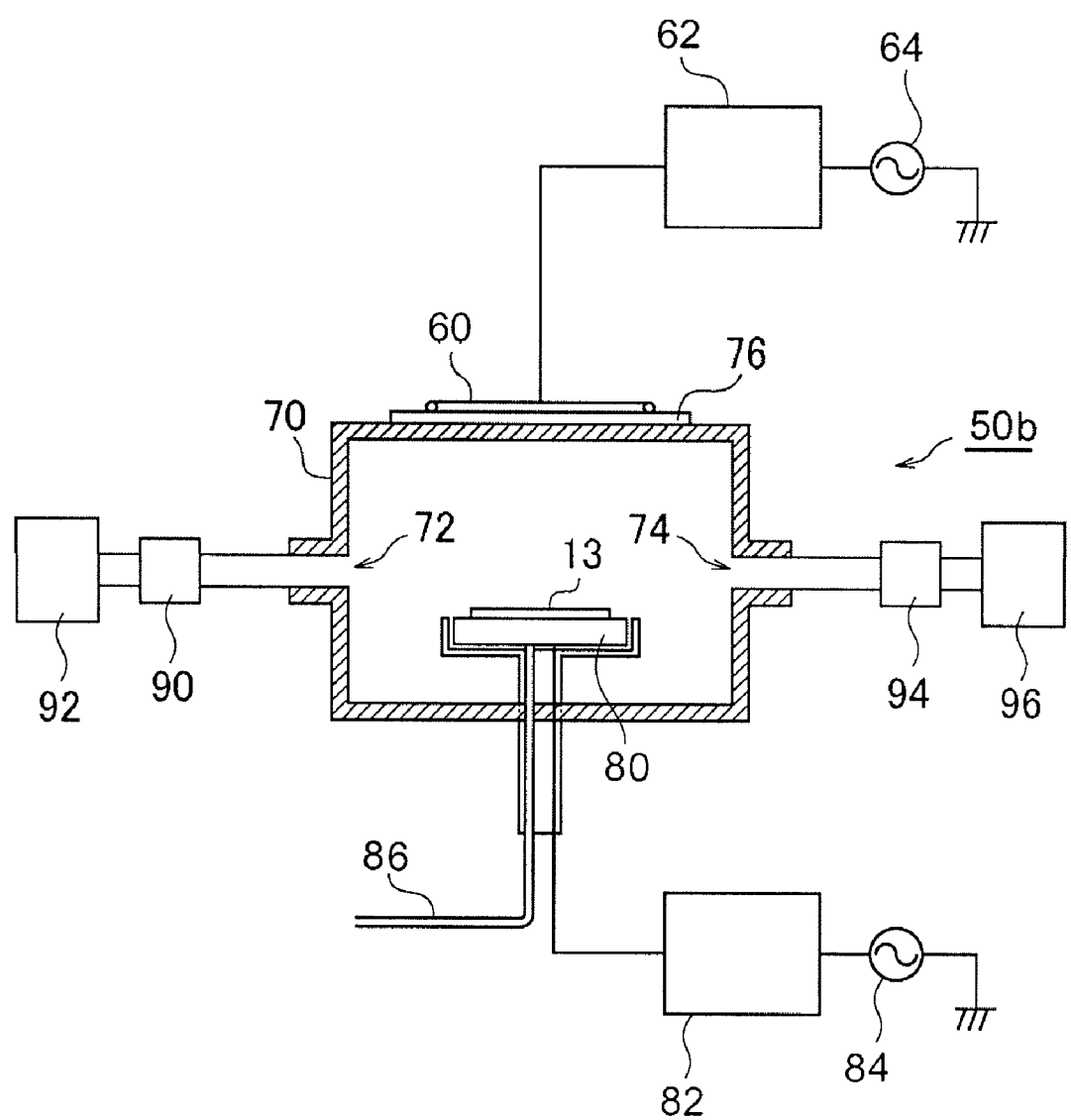
FIG. 6 is a schematic cross-sectional view showing inductively coupled plasma CVD equipment used in an embodiment of the present invention.
Figure 7A:
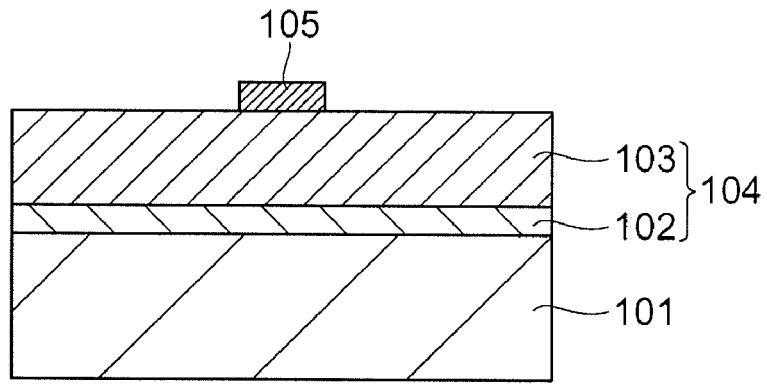
FIGS. 7A to 7D are views showing an example of a method of producing a conventional ridge type semiconductor optical device.
Figure 7B:
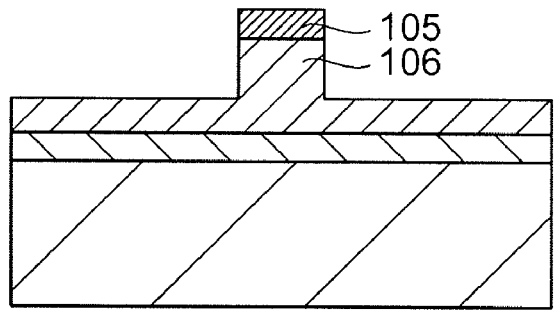
Figure 7C:
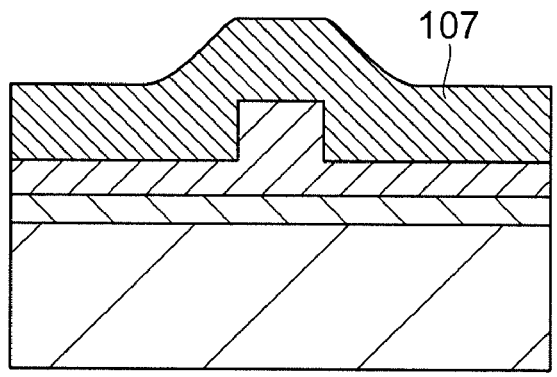
Figure 7D:
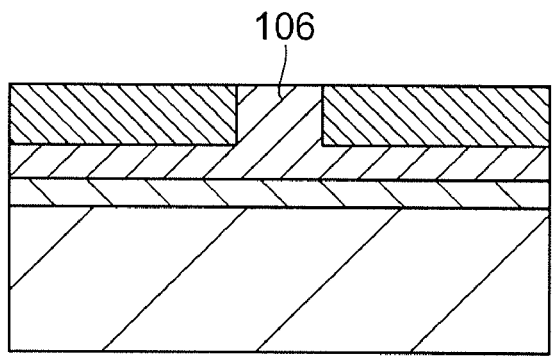

FIG. 6 is a schematic view showing the inductively coupled plasma (ICP) CVD equipment 50b. Referring to FIG. 6, the ICP CVD equipment 50b includes two high-frequency power sources of a high-frequency power source 84 and a high-frequency power source 64. Furthermore, the ICP CVD equipment 50b includes a chamber 70 and a susceptor 80 (support) which is disposed in the chamber 70. The susceptor 80 supports the semiconductor wafer including the stacked semiconductor layer 13. The chamber 70 has a supply port 72 for supplying a process gas and an exhaust port 74 for exhausting the process gas. The supply port 72 is connected through a mass flow controller (MFC) 90 for controlling the gas flow rate to a gas supply unit 92. The exhaust port 74 is connected through an exhaust amount adjusting valve 94 for adjusting the exhaust conductance to a vacuum pump 96.

The chamber 70 has a window 76 arranged so as to oppose the susceptor 80. The window 76 is used to introduce a high-frequency electromagnetic field into the chamber 70. The high-frequency electromagnetic field is generated by a coil 60 disposed outside the chamber 70.

A high-frequency power source 84 is connected through an impedance matching circuit 82 to the susceptor 80. The high-frequency power source 84 can apply a high-frequency power with a frequency of several hundred kilohertz to several megahertz and an output power of several tens of watts to several hundred watts to the susceptor 80 as a bias power. Furthermore, the matching circuit 82 can achieve impedance matching between the high-frequency power source 84 and the susceptor 80 so that the output power can be efficiently applied to the susceptor 80.

A cooling tube 86 for circulating cooling water to the susceptor 80 is connected to the susceptor 80. The cooling tube 86 can circulate cooling water inside the susceptor 80 or around the susceptor 80. Thereby, the temperature of the susceptor 80 can be prevented from rising due to the high-frequency power applied by the high-frequency power source 84.

Furthermore, high-frequency inductively coupled plasma (ICP) is generated in the chamber 70 by the coil 60. A high-frequency power source 64 is connected through a matching circuit 62 to the coil 60. The high-frequency power source 64 can apply a high-frequency power with a frequency of several tens of megahertz and an output power of several hundred watts to several thousand watts to the coil 60. Furthermore, the matching circuit 62 can achieve impedance matching between the high-frequency power source 64 and the coil 60 so that the output power can be efficiently applied to the coil 60.

In a preferred embodiment, as a raw material gas for forming the silicon oxide film 21, tetraethoxysilane (TEOS) and oxygen are used. In the inductively coupled plasma CVD equipment 50b, inductively coupled plasma (ICP) is generated by high-frequency discharge, and the raw material gas G1 is allowed to react in a plasma state. Therefore, the silicon oxide film can be formed at a relatively low temperature, for example, at 400° C. or at lower temperature than 400° C. Furthermore, in the inductively coupled plasma (ICP) CVD equipment 50b, the film quality of the silicon oxide film can be controlled by applying a bias power during the formation of the silicon oxide film. The bias power is applied to the susceptor 80 from the high-frequency power source 84. In particular, a film density and a film stress of the silicon oxide film are controlled by controlling the bias power. In general, a strain of a film increases as a film stress increases or as a thickness of a film increases. If the strain in the film becomes large, cracks or the like are generated in the film. To prevent the generation of the cracks or the like, the film stress should be reduced, especially in the case of forming a thicker film. In this ICP CVD method, a dense silicon oxide film with low film stress can be formed by controlling the bias power. Consequently, for example, even if a thick silicon oxide film with a thickness of about 10 μm is deposited, cracks or the like due to film stress are not generated. Furthermore, it is also possible to form a silicon oxide film at a high deposition rate of 300 nm/min or more by performing deposition using a raw material gas containing an organosilane compound, such as TEOS. The raw material gas containing an organosilane compound has high decomposition efficiency at relatively low temperatures.

The raw material gas G1 contains an organic silicon compound and oxygen. As the organic silicon compound, for example, an organosilane compound can be used. Specifically, for example, tetraethoxysilane (TEOS: $Si(OC_2H_5)_4$), triethoxyfluorosilane (TEFS: $Si(OC_2H_5)_3F$), trimethoxysilane ($HSi(OCH_3)_3$), or the like can be used.

Figure 2:
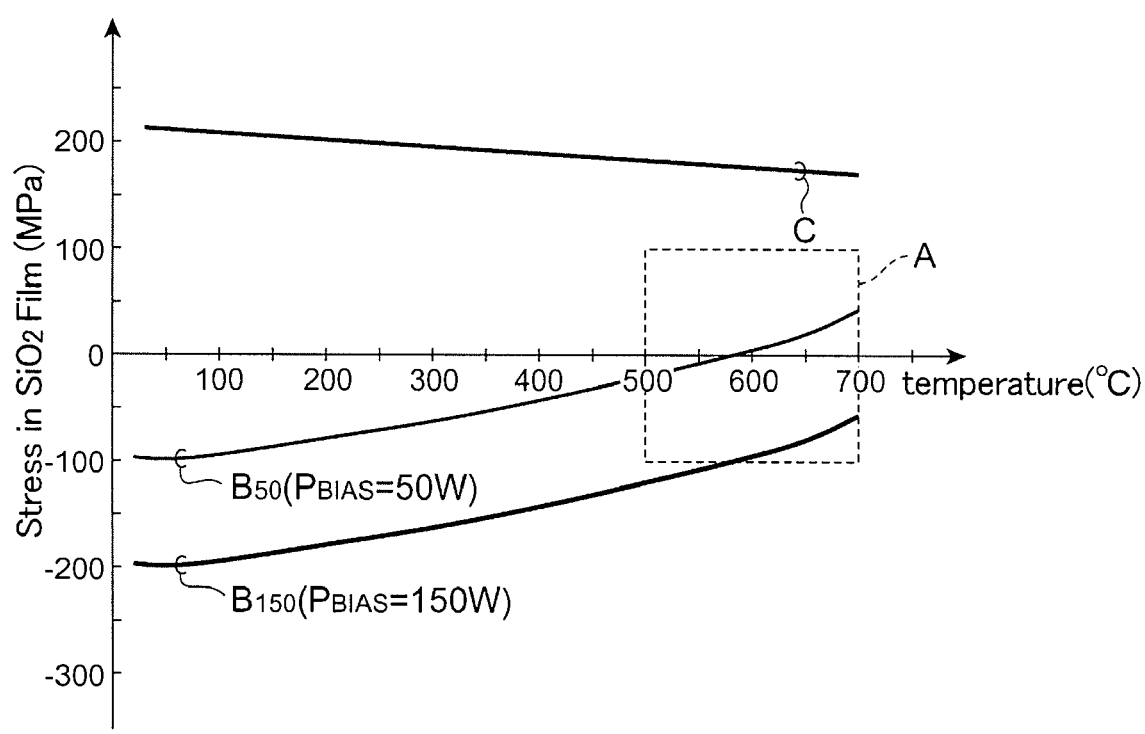
FIG. 2 is a graph showing the relationship between the stress and the temperature with respect to silicon oxide films deposited using inductively coupled plasma CVD equipment.

An example of conditions for forming the silicon oxide film 21 is as follows:

Raw material gas G1: tetraethoxysilane (TEOS) and oxygen ($O_2$)
TEOS flow rate: 10 sccm
$O_2$ flow rate: 100 sccm
Flow ratio: TEOS/$O_2$=1/10
Power of high-frequency power source 64, PIPC: 1,000 W
Bias Power of high-frequency power source 84, PBIAS: 0 to 300 W
Deposition pressure: 5 Pa or less
Deposition temperature (Substrate temperature): 400° C. or lower
Deposition rate: 300 nm/min or more
Thickness: 2 μm FIG. 2 is a graph showing the relationship between the stress (longitudinal axis) and the deposition temperature (horizontal axis) with respect to silicon oxide films deposited on the InP substrate using inductively coupled plasma CVD equipment. A positive stress indicates a "tensile stress", and a negative stress indicates a "compressive stress". The characteristic line $B_{50}$ shows the relationship between the film stress and the deposition temperature when the bias power PBIAS is 50 W. Similarly, the characteristic line $B_{150}$ shows the relationship between the film stress and the deposition temperature when the bias power PBIAS is 150 W. The silicon oxide films represented by the characteristic line $B_{50}$ and the characteristic line $B_{150}$ have compressive stress at room temperature. Furthermore, the silicon oxide films represented by the characteristic line $B_{50}$ and the characteristic line $B_{150}$ have a positive temperature coefficient of stress, and as the temperature increases, the absolute value of the film stress decreases. The temperature coefficient is, for example, in a range of +0.1 to +0.3 MPa/° C. The compressive film stress changes to the tensile film stress at a certain temperature. The silicon oxide film deposited at lower bias power has a smaller absolute value of compressive film stress. The silicon oxide film deposited at higher bias power has a larger absolute value of compressive film stress. Note that the film stress of a silicon oxide film can be measured using the fact that, when the silicon oxide film is formed on a semiconductor substrate, the semiconductor substrate bends in accordance with the magnitude of the stress of the silicon oxide film. Specifically, a silicon oxide film is formed on a semiconductor substrate under predetermined conditions, and then the amount of warpage of the semiconductor substrate is measured. Thereby, the measurement of the film stress can be performed.

The characteristic line C shows the relationship between the stress and the deposition temperature of a silicon nitride film (thickness: about 500 nm) formed, for comparison, using conventional plasma CVD equipment other than the inductively coupled plasma CVD equipment. The conventional plasma CVD equipment is not provided with means for applying bias power in order to control film stress during forming a silicon nitride film or a silicon oxide film. Furthermore, the silicon nitride film formed on the semiconductor substrate using the conventional plasma CVD equipment has tensile stress as shown by the characteristic line C in FIG. 2. In the case of a silicon oxide film, the silicon oxide film also has tensile stress during film formation when the silicon oxide film is formed on the semiconductor substrate using the conventional plasma CVD equipment. A tensile stress in the film generates defects, such as cracks of the film and separation of the film, more easily than a compressive stress. Consequently, when a silicon oxide film with a large thickness of 500 nm or more is deposited on the semiconductor substrate by using the conventional plasma CVD equipment, such defects as cracks of the film and separation of the film, are generated in the process of deposition the silicon oxide film or decreasing the substrate temperature after deposition at high temperature. In the case of the silicon oxide film, the difference in thermal expansion coefficient between the silicon oxide film and the semiconductor substrate is larger than the case of the silicon nitride film, and cracks of the film or separation of the film more easily occur. Consequently, it was difficult to measure the film stress accurately. Therefore, the relationship between the stress and the deposition temperature for the silicon nitride film is shown in FIG. 2. In this embodiment, it is necessary to form a thick silicon oxide film with a thickness of about 1 to 2 μm. The influence of film stress generally increases as the thickness of the film increases. Therefore, when the thick silicon oxide film is used, the influence of tensile stress is large in the case of forming the silicon oxide film by using the conventional plasma CVD equipment. Furthermore, when the stacked semiconductor layer is grown at high temperature of more than 500° C. after the silicon oxide film is formed, defects, such as breaking of the semiconductor substrate, may occur due to the high thermal stress of the silicon oxide film.

In contrast, in this embodiment, when the silicon oxide film 21 is formed on the stacked semiconductor layer 13 using the inductively coupled plasma CVD equipment 50b, by controlling the bias power PBIAS of the inductively coupled plasma CVD equipment 50b, the film stress and the temperature coefficient can be adjusted (refer to FIG. 2).

According to an embodiment, for example, as in a rectangular region A indicated by a dotted line in FIG. 2, preferably, the film stress is low, i.e., equal to or higher than −100 MPa and equal to or lower than +100 MPa in the temperature range of 500° C. to 700° C. The film stress in the range described above can be obtained by setting the bias power PBIAS, for example, at 50 W (corresponding to the characteristic line B50 in FIG. 2).

More preferably, the film stress of the silicon oxide film 21 is low compressive film stress that is equal to or higher than −100 MPa and equal to or lower than 0 MPa in the temperature range of 500° C. to 700° C. The film stress in this range can be obtained by setting the bias power PBIAS, for example, at 150 W. In the silicon oxide film 21 according to this embodiment, film strain can be kept low during the deposition at high temperatures, and the silicon oxide film 21 includes compressive stress even after the substrate temperature is decreased to room temperature. In general, it is known that in a silicon nitride film or a silicon oxide film having compressive stress, cracks or film separation do not easily occur compared with a silicon nitride film or a silicon oxide film having tensile stress. Consequently, by using the silicon oxide film 21 formed by the method according to this embodiment, the occurrence of cracks or separation in the silicon oxide film can be reduced even when a thick silicon oxide film with a thickness of 1 μm or more is formed. Furthermore, even when a semiconductor layer is grown at a temperature of 500° C. or higher on the semiconductor substrate provided with the silicon oxide film, it is possible to prevent the occurrence of cracks or separation in the silicon oxide film.

(Third Step)

Figure 3A:
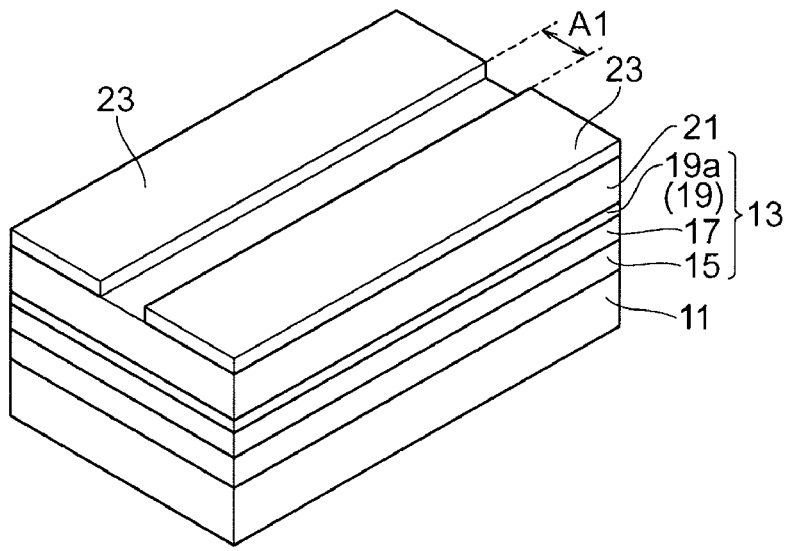
FIGS. 3A to 3C are views showing an etching step, which is a third step.

Next, as shown in FIG. 3A, a pattern 23 which is composed of a photo sensitive resist and has a strip-shaped opening is formed on the silicon oxide film 21, for example, by photolithography. In the resist pattern 23, the width A1 is, for example, 1 to 2 μm.

Figure 3B:
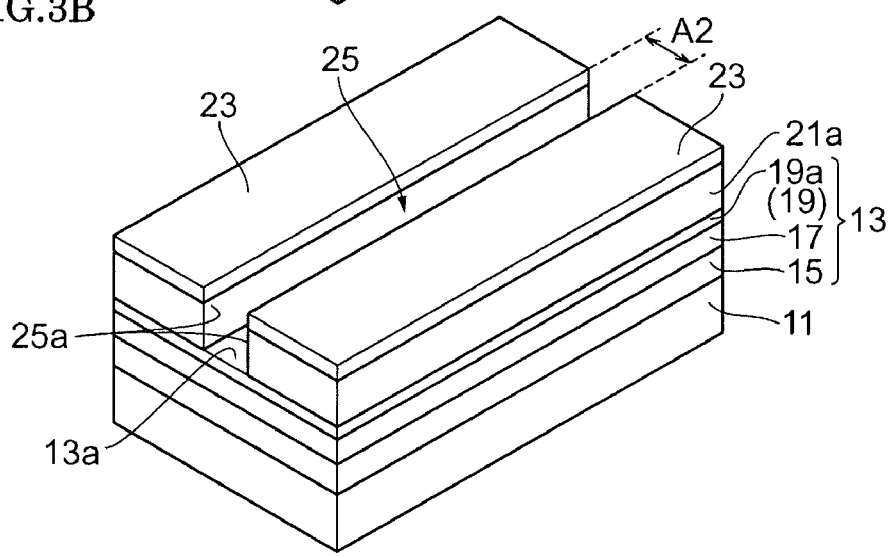

Next, as shown in FIG. 3B, the silicon oxide film 21 is etched, for example, by dry etching, such as reactive ion etching (RIE), using the resist pattern 23 as an etching mask. The dry etching is performed so that the side wall surface 25a of the silicon oxide film 21 is substantially perpendicular to the stacked surface (e.g., surface 13a) of the stacked semiconductor layer 13. And the dry etching is stopped after the surface 13a of the stacked semiconductor layer 13 is exposed. An example of the dry etching conditions is as follows:

Etching gas: $CF_4$
Plasma power: 100 W

After dry etching process, the silicon oxide film 21a, as shown in FIG. 3B, a strip-shaped groove 25 is formed. The strip-shaped groove 25 has a side wall surface 25a that extends substantially perpendicularly from the surface 13a of the stacked semiconductor layer 13. The width A2 of the groove 25 is substantially the same as the width A1 of the resist pattern 23, and is, for example, 1 to 2 μm.

Figure 3C:
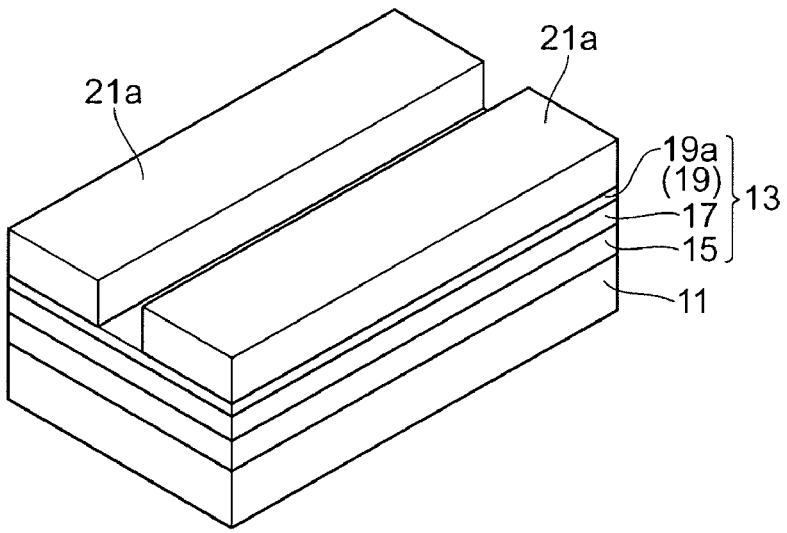

Next, as shown in FIG. 3C, the resist pattern 23 is removed. The resist pattern 23 can be removed, for example, by $O_2$ ashing or using an organic solvent.

(Fourth Step)

Figure 4A:
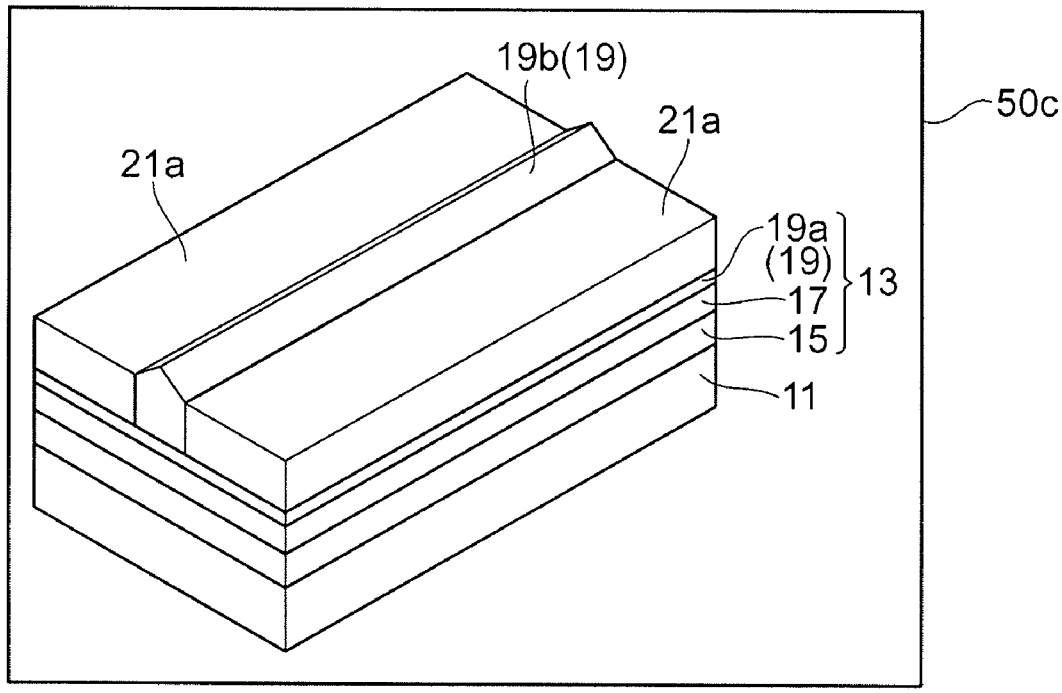
FIGS. 4A and 4B are views showing an epitaxial growth step, which is a fourth step.

Next, as shown in FIG. 4A, another portion 19b of the p-type cladding layer 19 is selectively grown in the groove 25 formed in the third step using the silicon oxide film 21a as a selective mask. The portion 19b of the p-type cladding layer 19 is, for example, a p-type InP semiconductor, as in the portion 19a of the p-type cladding layer 19. In this step, the portion 19b of the p-type cladding layer 19 is grown with substantially the same thickness as the thickness of the silicon oxide film 21a. In order to grow the portion 19b of the p-type cladding layer 19, for example, a metal-organic vapor phase epitaxy (MOVPE) method can be used. In this embodiment, as shown in FIG. 4A, using a metal-organic vapor phase epitaxy furnace 50c, the portion 19b of the p-type cladding layer 19 is grown, for example, in the temperature range of 500° C to 700° C.

Figure 4B:
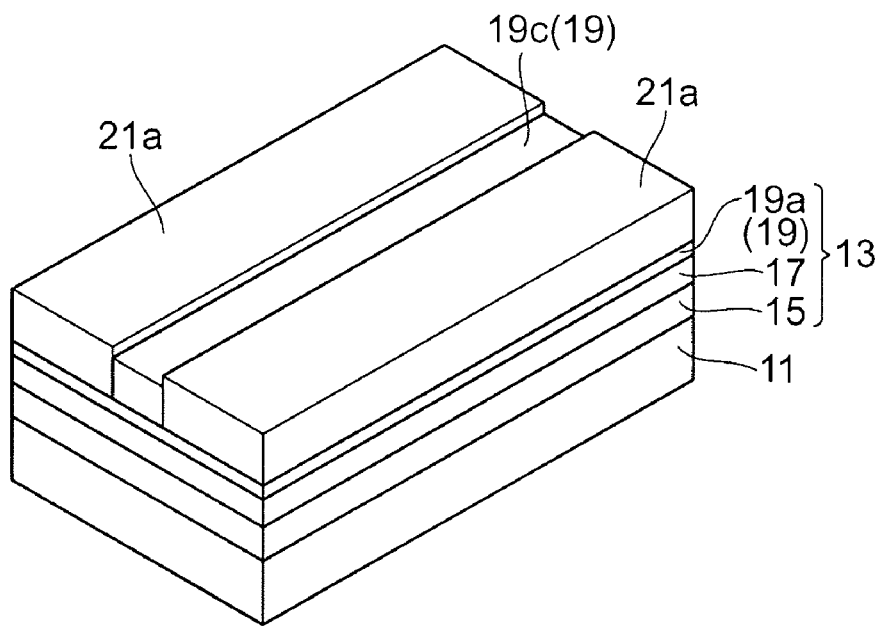

Next, as shown in FIG. 4B, another portion 19c of the p-type cladding layer 19 is formed by planarizing the surface of the portion 19b of the p-type cladding layer 19, for example, by wet etching. The planarized portion 19c of the p-type cladding layer 19 has a thickness that is slightly smaller than the thickness of the silicon oxide film 21a. For example, the portion 19c of the p-type cladding layer 19 is formed with a thickness that is 0.2 μm smaller than the thickness of the silicon oxide film 21a. Referring to FIG. 4A, the (111) plane appears at the surface of the portion 19b of the p-type cladding layer 19 due to selective growth. For example, by using a mixed solution of hydrochloric acid and acetic acid (HCl:CH$_3$COOH:H$_2$O=1:5:1) as an etchant, the (111) plane can be anisotropically etched. By such etching, the portion 19c with a planar surface can be formed.

(Fifth Step)

Figure 5A:
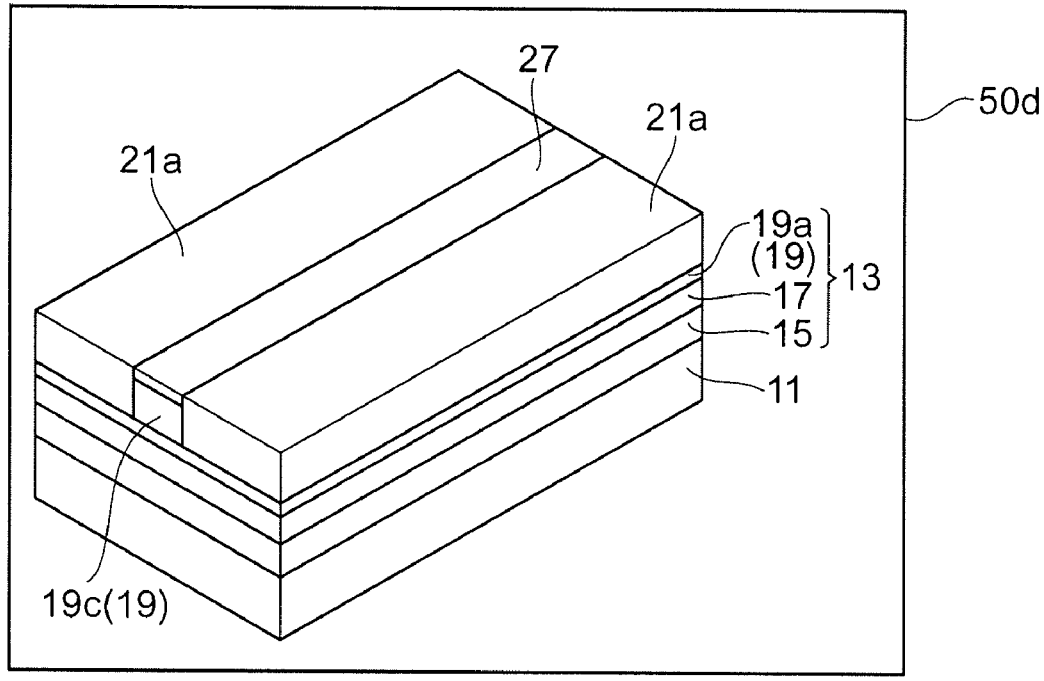
FIG. 5A is a view showing an epitaxial growth step, which is a fifth step.

Next, as shown in FIG. 5A, a contact layer 27 (fourth III-V group compound semiconductor layer) is selectively grown on the portion 19c of the p-type cladding layer 19, which has been planarized in the fourth step. The contact layer 27 is, for example, a p-type GaInAs semiconductor with a thickness of 0.2 μm. In order to grow the contact layer 27, for example, a metal-organic vapor phase epitaxy (MOVPE) method can be used. In this embodiment, as shown in FIG. 5A, using a metal-organic vapor phase epitaxy furnace 50d, the contact layer 27 is grown, for example, in the temperature range of 500° C. to 700° C. By growing the contact layer 27, the surface of the contact layer and the surface of the silicon oxide film 21a can be located substantially on the same level.

(Sixth Step)

Figure 5B:
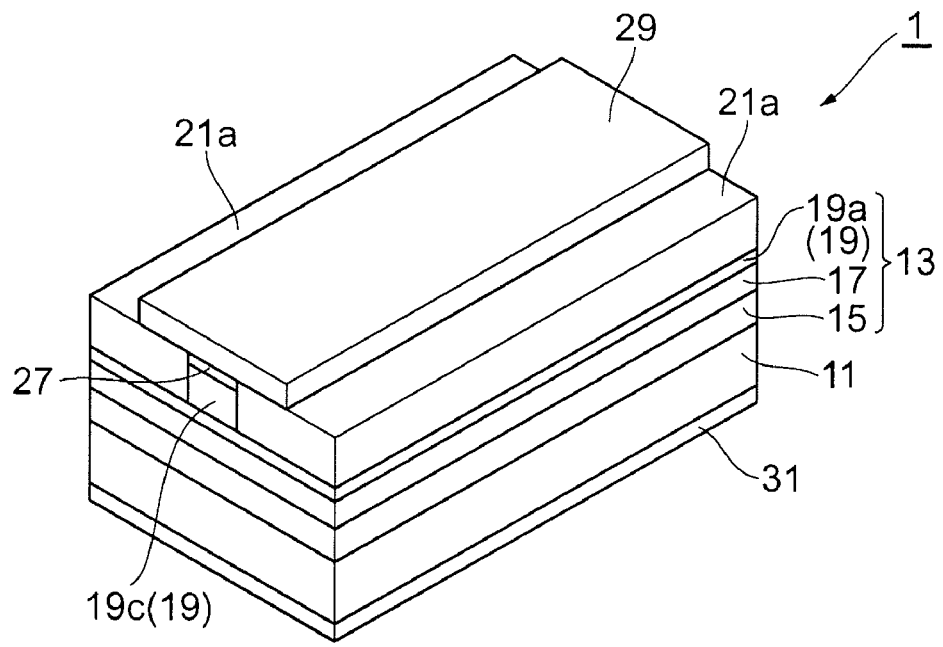
FIG. 5B is view showing an electrode formation step, which is a sixth step.

Next, as shown in FIG. 5B, an upper electrode 29 and a backside electrode 31 are formed. Here, a step of opening a window for injecting current, which is conventionally carried out before formation of the upper electrode 29, is not required in this embodiment. The reason for this is that, by dry etching the silicon oxide film 21, the groove 25 has already been formed. Thereby, the semiconductor laser 1 is completed.

The advantages of the method of producing the semiconductor optical device according to this embodiment will be described below. According to this embodiment, by carrying out the first to fifth steps in that order, it is possible to produce a ridge type semiconductor optical device without polishing a silicon oxide film formed on the ridge. Therefore, it is possible to prevent the semiconductor wafer from being damaged by polishing.

By using the ICP CVD method in this embodiment, the silicon oxide film 21 is formed such that the film stress is, preferably, equal to or higher than −100 MPa and equal to or lower than +100 MPa, and more preferably, equal to or higher than −100 MPa and equal to or lower than 0 MPa in a temperature range of 500° C. to 700° C. by controlling the bias power. After forming the silicon oxide film 21, the portion 19b of the p-type cladding layer 19 is selectively grown in this temperature range of 500° C. to 700° C. by using the silicon oxide film 21 as a selective mask. In this process, the silicon oxide film 21 used as a selective mask has low stress. Consequently, it is possible to prevent, for example, the substrate 11 from being broken due to the stress of the silicon oxide film 21 when the portion 19b of the p-type cladding layer 19 is selectively grown by the MOVPE method. Furthermore, since the portion 19b of the p-type cladding layer 19 is grown in the groove 25 formed in the silicon oxide film 21 having low stress, the portion 19b can be grown in the groove 25 without thermally deforming the shape of the groove. Furthermore, the silicon oxide film 21 has compressive stress in the wide temperature range from room temperature to about 700° C. In general, it is known that the occurrence of cracks or separation in the silicon oxide film is more reduced by compressive stress than by tensile stress. Consequently, in the silicon oxide film 21 having compressive stress, the occurrence of cracks or separation in the silicon oxide film can be reduced. Furthermore, even when a high-temperature process, such as a growth step after the film formation, is carried out, the occurrence of cracks or separation can be effectively prevented. Furthermore, the magnitude of the compressive strain included in the silicon oxide film at room temperature can be appropriately adjusted in consideration of the influence on the active layer, etc. Thus, the reliability of the optical device is improved by controlling the strain included in the silicon oxide film.

Furthermore, the silicon oxide film 21 with substantially the same thickness as the thickness of the portion 19b having the thickness of about 0.5 μm or more is formed in the fourth step. It is possible to easily grow the thick portion 19b of the p-type cladding layer 19. As a result, the p-type cladding layer 19 including the thick portion 19b confines the optical light in the active layer. Furthermore, after forming the semiconductor optical device, the silicon oxide film 21a used as the selective mask is not removed and remains at the sides of the semiconductor ridge. For the semiconductor optical device 1, the thick silicon oxide film 21 leads to a decrease in the capacitance of the semiconductor device. As a result, the semiconductor optical device 1 has a high-speed operation characteristics due to having a low capacitance.

Furthermore, since the silicon oxide film 21 is etched substantially perpendicularly by dry etching process, the wall surface 25a of the groove 25 becomes substantially perpendicular to the surface 13a of the stacked semiconductor layer 13. As a result, the portion 19b of the p-type cladding layer 19 can be grown in the groove 25 substantially perpendicularly. Therefore, the width of the portion 19b of the p-type cladding layer 19 can be accurately controlled.

Furthermore, the silicon oxide film 21 is preferably formed using inductively coupled plasma CVD equipment. In such a case, by controlling the bias power of the inductively coupled plasma CVD equipment, the film stress of the silicon oxide film 21 can be appropriately adjusted depending on the situation.

Preferably, the silicon oxide film 21 has a positive temperature coefficient of film stress between room temperature and the growth temperature during the growth of the portion 19b of the p-type cladding layer 19. In such a case, the film stress of the silicon oxide film 21 decreases as the temperature increases during the growth of the portion 19b of the p-type cladding layer 19.

Furthermore, in the method of producing the semiconductor optical device according to this embodiment, since a step of opening a window, which is difficult to carry out, is not required, the cost for producing the semiconductor optical device can be reduced.

While the principle of the present invention has been illustrated and described above in the preferred embodiments of the invention, it will be appreciated by those skilled in the art that the present invention may be varied in arrangement and detail without departing from the principle. The present invention is not limited to the specific structures disclosed in the embodiments. In the embodiments, although the semiconductor laser is described as the example, the present invention is also applicable to a semiconductor light modulator, a device in which a semiconductor light modulator and a semiconductor laser are integrated, and the like. Therefore, all the modifications and alterations within the scope of the claims or the spirit of the invention are to be construed as being covered by the claims.

What is claimed is:

1. A method of producing a semiconductor optical device comprising:
   a first step of growing a stacked semiconductor layer including a first III-V group compound semiconductor layer for an active layer on a substrate;
   a second step of forming a silicon oxide film on the stacked semiconductor layer, the silicon oxide film having a predetermined film stress and a predetermined thickness;

a third step of forming a strip-shaped groove in the silicon oxide film by etching the silicon oxide film, using a resist pattern formed on the silicon oxide film, until a surface of the stacked semiconductor layer is exposed; and a fourth step of growing a second III-V group compound semiconductor layer in the groove using the silicon oxide film as a selective mask, wherein the silicon oxide film is formed using inductively coupled plasma CVD equipment, and the film stress of the silicon oxide film is adjusted by controlling the bias power of the inductively coupled plasma CVD equipment.

2. The method according to claim 1, wherein, in the second step, the silicon oxide film is formed such that the film stress is equal to or higher than −100 MPa and equal to or lower than +100 MPa in a temperature range of 500.degree. C. to 700.degree. C., and in the fourth step, the second III-V group compound semiconductor layer is grown in the temperature range of 500.degree. C. to 700.degree. C.

3. The method according to claim 1, wherein, in the second step, the silicon oxide film is formed such that the film stress is equal to or higher than −100 MPa and equal to or lower than 0 MPa in the temperature range of 500.degree. C. to 700.degree. C., and in the fourth step, the second III-V group compound semiconductor layer is grown in the temperature range of 500.degree. C. to 700.degree. C.

4. The method according to claim 1, wherein the silicon oxide film has a positive temperature coefficient of film stress between room temperature and the growth temperature during the growth of the second III-V group compound semiconductor layer in the fourth step.

5. The method according to claim 1, wherein, in the fourth step, the second III-V group compound semiconductor layer is grown by metal-organic vapor phase epitaxy.

6. The method according to claim 1, wherein, in the second step, the predetermined thickness of the silicon oxide film is substantially the same as the thickness of the second III-V group compound semiconductor layer.

7. The method according to claim 1, wherein, in the second step, the predetermined thickness of the silicon oxide film is 1 μm or more.

8. The method according to claim 1, wherein, in the third step, the silicon oxide film is etched substantially perpendicularly to a stacked surface of the stacked semiconductor layer.

9. The method according to claim 1, wherein, in the first step, the stacked semiconductor layer is grown by growing a third III-V group compound semiconductor layer for a cladding layer of a first conductivity type and the first III-V group compound semiconductor layer for the active layer in that order;

in the fourth step, the second III-V group compound semiconductor layer is a III-V group compound semiconductor layer for a cladding layer of a second conductivity type; and the method further comprises a fifth step of growing a fourth III-V group compound semiconductor layer for a contact layer on the second III-V group compound semiconductor layer; and a sixth step of forming an electrode on the fourth III-V group compound semiconductor layer.

* * * * *